United States Patent
Matsumura et al.

(10) Patent No.: US 9,589,591 B2
(45) Date of Patent: Mar. 7, 2017

(54) SIGNAL PROCESSING DEVICE, SIGNAL PROCESSING METHOD, AND COMPUTER PROGRAM

(71) Applicant: SONY CORPORATION, Tokyo (JP)

(72) Inventors: Yuuki Matsumura, Saitama (JP); Shiro Suzuki, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 167 days.

(21) Appl. No.: 14/534,592

(22) Filed: Nov. 6, 2014

(65) Prior Publication Data

US 2015/0142455 A1 May 21, 2015

(30) Foreign Application Priority Data

Nov. 18, 2013 (JP) ................................. 2013-237847

(51) Int. Cl.
| | |
|---|---|
| *G11B 20/10* | (2006.01) |
| *H03M 7/30* | (2006.01) |
| *H03M 3/00* | (2006.01) |
| *G11B 20/00* | (2006.01) |

(52) U.S. Cl.
CPC .. *G11B 20/10037* (2013.01); *G11B 20/10027* (2013.01); *H03M 7/3013* (2013.01); *G11B 2020/00065* (2013.01); *H03M 3/30* (2013.01); *H03M 7/3004* (2013.01); *H03M 7/3031* (2013.01); *H03M 7/3044* (2013.01); *H03M 7/3048* (2013.01)

(58) Field of Classification Search
CPC ...... G11B 2020/00065; H03M 7/3013; H03M 3/30; H03M 7/3031; H03M 7/3004; H03M 7/3044; H03M 7/3048
See application file for complete search history.

(56) References Cited

U.S. PATENT DOCUMENTS

| | | | | |
|---|---|---|---|---|
| 5,574,453 A | * | 11/1996 | Nishio | G11B 20/10009 341/143 |
| 5,793,316 A | * | 8/1998 | Noguchi | H03M 7/3013 341/141 |
| 6,064,700 A | * | 5/2000 | Noguchi | H03M 7/3013 341/141 |

(Continued)

FOREIGN PATENT DOCUMENTS

JP 3318823 B2 8/2002

*Primary Examiner* — Samuel G Neway
(74) *Attorney, Agent, or Firm* — Chip Law Group

(57) ABSTRACT

There is provided a signal processing device including a signal coincidence detection portion which detects samples, in which values based on a number of times of appearance of bits coincide with each other over a plurality of samples within a pre-set period, between a first modulated signal obtained by delaying an input signal obtained by ΣΔ modulation and a second modulated signal obtained by subjecting the input signal to the ΣΔ modulation again, a signal changeover portion which switches between the first modulated signal and the second modulated signal for outputting, and a switching control portion which controls the switching between the first modulated signal and the second modulated signal by the signal changeover portion in the samples in which the values based on the number of times of the appearance coincide with each other obtained by the signal coincidence detection portion.

11 Claims, 16 Drawing Sheets

(56) References Cited

U.S. PATENT DOCUMENTS

| | | | | |
|---|---|---|---|---|
| 7,068,196 B2* | 6/2006 | Noguchi | ............. | H03M 7/3011 |
| | | | | 341/143 |
| 2007/0241951 A1* | 10/2007 | Neubauer | ........... | H03M 7/3015 |
| | | | | 341/143 |
| 2015/0142455 A1* | 5/2015 | Matsumura | ...... | G11B 20/10027 |
| | | | | 704/500 |

* cited by examiner

FIG.2

| 1-BIT SIGNALS OF FOUR SAMPLES | 01 APPEARANCE FREQUENCY OF FOUR SAMPLES | SIGNAL LEVEL OF FOUR SAMPLES |
|---|---|---|
| 0000 | 4/0 | −4 |
| 0001 | 3/1 | −2 |
| 0010 | 3/1 | −2 |
| 0011 | 2/2 | 0 |
| 0100 | 3/1 | −2 |
| 0101 | 2/2 | 0 |
| 0110 | 2/2 | 0 |
| 0111 | 1/3 | +2 |
| 1000 | 3/1 | −2 |
| 1001 | 2/2 | 0 |
| 1010 | 2/2 | 0 |
| 1011 | 1/3 | +2 |
| 1100 | 2/2 | 0 |
| 1101 | 1/3 | +2 |
| 1110 | 1/3 | +2 |
| 1111 | 0/4 | +4 |

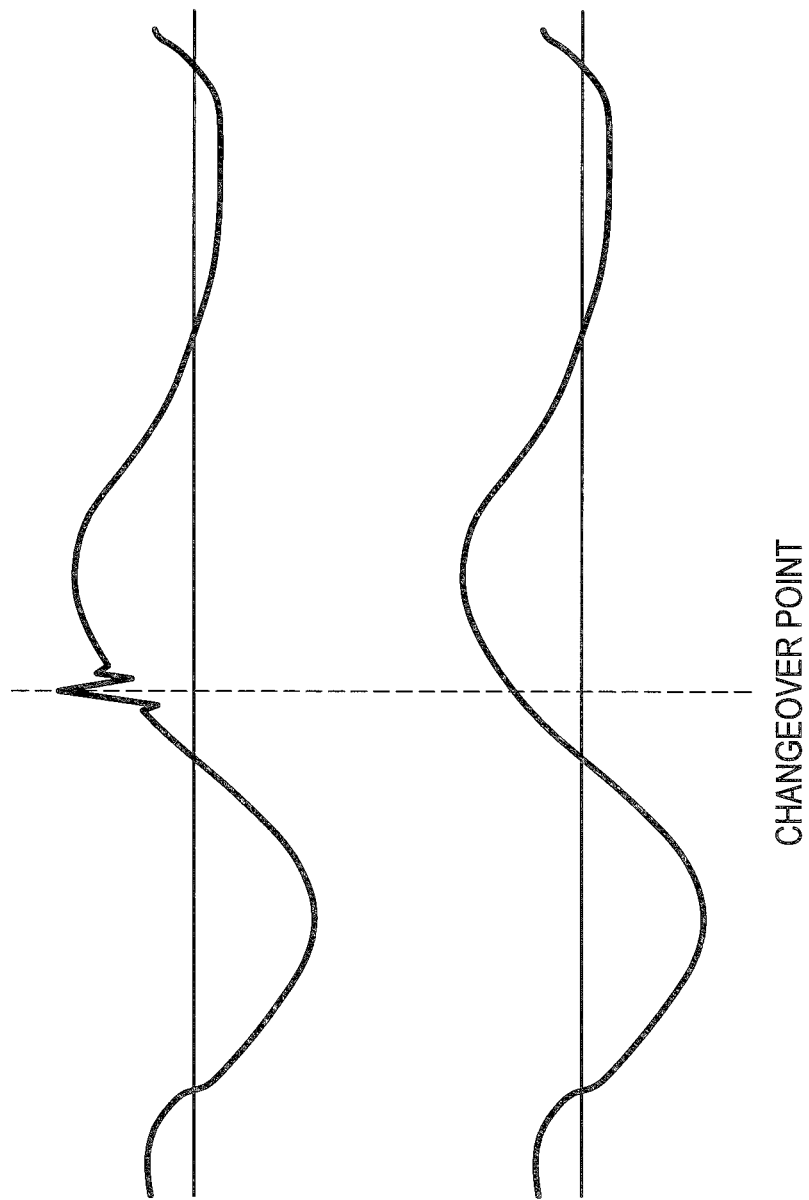

SIGNAL PROCESSING DEVICE, SIGNAL PROCESSING METHOD, AND COMPUTER PROGRAM

CROSS REFERENCE TO RELATED APPLICATIONS

This application claims the benefit of Japanese Priority Patent Application JP 2013-237847 filed Nov. 18, 2013, the entire contents of which are incorporated herein by reference.

BACKGROUND

The present disclosure relates to a signal processing device, a signal processing method, and a computer program.

A method of digitizing audio signals for recording, reproduction, and transmission is implemented in a recording/reproducing apparatus for a tape-shaped recording medium, including an optical disc, such as a compact disc (CD), or a digital audio tape (DAT), or in digital broadcasting, such as satellite broadcasting. In such a digital audio transmission apparatus, the format has conventionally been set for the sampling frequency of 48 kHz, 44.1 kHz, or the like and the number of quantization bits of 16 bits, 24 bits, or the like for digitization.

As a method of digitizing audio signals, a method termed $\Sigma\Delta$ ($\Sigma\Delta$) modulation has been proposed (see Yoshio Yamazaki, "AD/DA converter and Digital Filter", Journal of Japan Society of Acoustics, Vol. 46, No. 3 (1990), pp. 251-257. In addition, a digital signal processing device which performs fade processing while switching between a delayed $\Sigma\Delta$ modulated signal in which a $\Sigma\Delta$ modulated signal is delayed and a $\Sigma\Delta$ re-modulated signal obtained by subjecting an input signal to the $\Sigma\Delta$ modulation again has been proposed (for example, JP 3318823B). The signal processing device described in JP 3318823B is configured so that a pattern detector is provided for reducing noises generated in the fade processing as much as possible and when the pattern detector detects coincidence between the delayed $\Sigma\Delta$ modulated signal and the $\Sigma\Delta$ re-modulated signal over a plurality of samples, a changeover switch switches the output state of both the signals, and then performs fade processing capable of suppressing the generation of noises.

SUMMARY

In the technique described in JP 3318823B, the number of samples (time) for detecting pattern coincidence is not prescribed. When it is demanded to switch between the original $\Sigma\Delta$ modulated signal and the $\Sigma\Delta$ re-modulated signal in which the original $\Sigma\Delta$ modulated signal is subjected to the $\Sigma\Delta$ modulation again within a pre-set number of samples (time), it is demanded to reduce the generation of noises at a changeover point. Accordingly, the present disclosure provides a novel and improved signal processing device, a novel and improved signal processing method, and a novel and improved computer program of reducing the generation of noises at a changeover point when it is demanded to switch between the original $\Sigma\Delta$ modulated signal and the $\Sigma\Delta$ re-modulated signal in which the original $\Sigma\Delta$ modulated signal is subjected to the $\Sigma\Delta$ modulation again within a pre-set number of samples (time).

According to an embodiment of the present disclosure, there is provided a signal processing device including a signal coincidence detection portion which detects samples, in which values based on a number of times of appearance of bits coincide with each other over a plurality of samples within a pre-set period, between a first modulated signal obtained by delaying an input signal obtained by $\Sigma\Delta$ modulation and a second modulated signal obtained by subjecting the input signal to the $\Sigma\Delta$ modulation again, a signal changeover portion which switches between the first modulated signal and the second modulated signal for outputting, and a switching control portion which controls the switching between the first modulated signal and the second modulated signal by the signal changeover portion in the samples in which the values based on the number of times of the appearance coincide with each other obtained by the signal coincidence detection portion.

According to another embodiment of the present disclosure, there is provided a signal processing method including detecting samples, in which values based on a number of times of appearance of bits coincide with each other over a plurality of samples within a pre-set period, between a first modulated signal obtained by delaying an input signal obtained by $\Sigma\Delta$ modulation and a second modulated signal obtained by subjecting the input signal to the $\Sigma\Delta$ modulation again, switching between the first modulated signal and the second modulated signal for outputting, and controlling the switching between the first modulated signal and the second modulated signal in the samples in which the values based on the number of times of the appearance coincide with each other.

According to another embodiment of the present disclosure, there is provided a computer program, which causes a computer to execute the following processes of detecting samples, in which values based on a number of times of appearance of bits coincide with each other over a plurality of samples within a pre-set period, between a first modulated signal obtained by delaying an input signal obtained by $\Sigma\Delta$ modulation and a second modulated signal obtained by subjecting the input signal to the $\Sigma\Delta$ modulation again, switching between the first modulated signal and the second modulated signal for outputting, and controlling the switching between the first modulated signal and the second modulated signal in the samples in which the values based on the number of times of the appearance coincide with each other.

As described above, the present disclosure can provide a novel and improved signal processing device, a novel and improved signal processing method, and a novel and improved computer program of reducing the generation of noises at a changeover point when it is demanded to switch between the original $\Sigma\Delta$ modulated signal and the $\Sigma\Delta$ re-modulated signal in which the original $\Sigma\Delta$ modulated signal is subjected to the $\Sigma\Delta$ modulation again within a pre-set number of samples (time).

The above-described effects are not always restrictive and any one of the effects described in this specification or other effects understandable from this specification may be demonstrated with the above-described effects or in place of the above-described effects.

BRIEF DESCRIPTION OF THE DRAWINGS

FIG. 2 is an explanatory diagram for explaining the level of 1-bit signals;

FIG. 14 is an explanatory diagram illustrating an example of the configuration of a circuit which performs fade processing and the like;

FIG. 15 is an explanatory diagram illustrating an example of the configuration of the circuit which performs fade processing and the like; and FIG. 16 is a diagram illustrating a state where a significant noise is generated at a changeover point.

DETAILED DESCRIPTION OF THE EMBODIMENT

Figure 1:
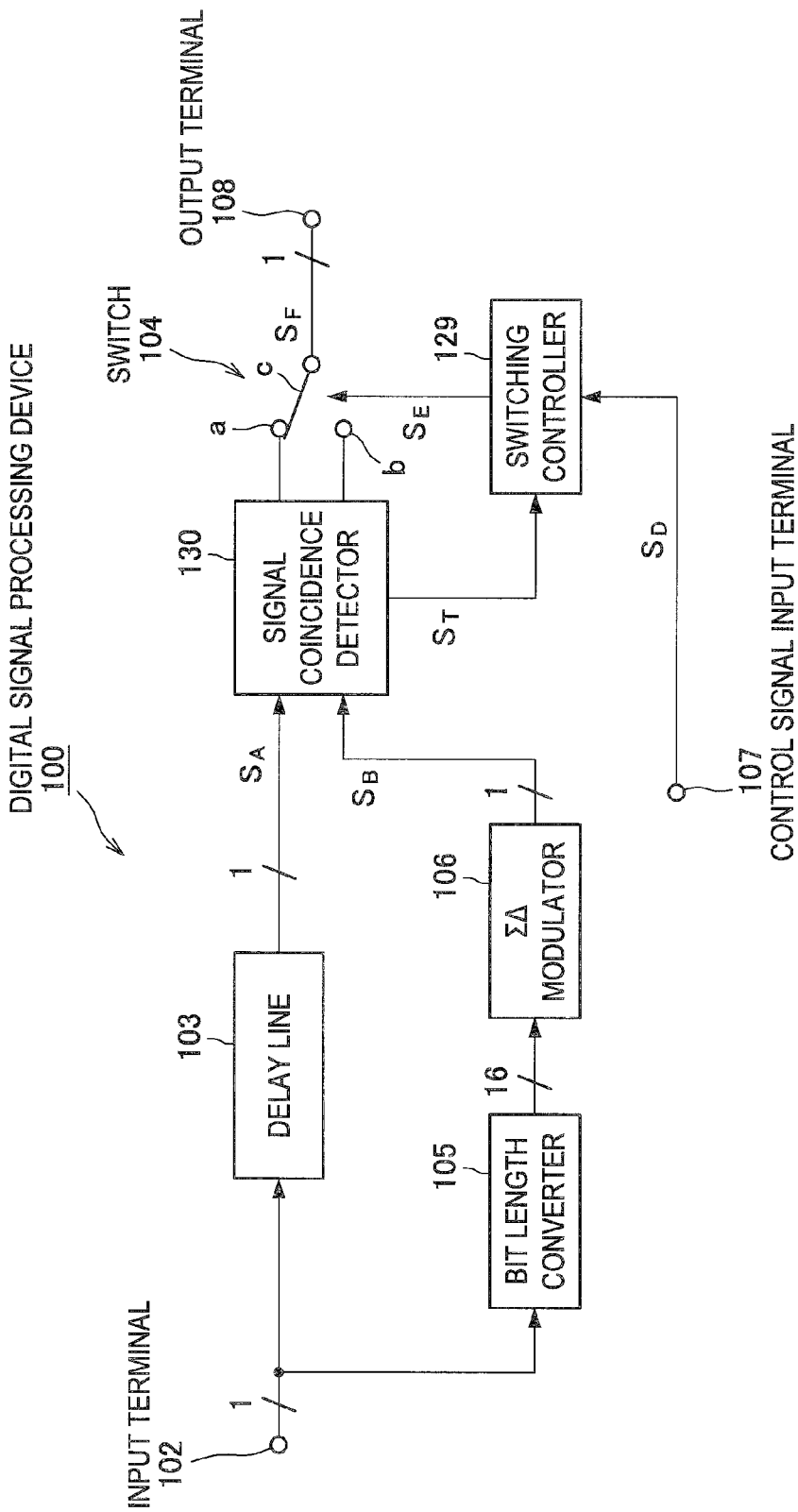
FIG. 1 is an explanatory diagram for explaining an example of the configuration of a digital signal processing device 100 according to one embodiment of the present disclosure.

Hereinafter, preferred embodiments of the present disclosure will be described in detail with reference to the appended drawings. Note that, in this specification and the appended drawings, structural elements that have substantially the same function and structure are denoted with the same reference numerals, and repeated explanation of these structural elements is omitted.

The description is given in the following order.
1. Description of prior art
2. One embodiment of this disclosure
2.1. Example of configuration of signal processing device
2.2. Example of operation of signal processing device
3. Conclusion

1. DESCRIPTION OF PRIOR ART

First, a prior art of the present disclosure is described. The prior art of the present disclosure is described, and then an embodiment of the present disclosure is described in detail.

Figure 12:
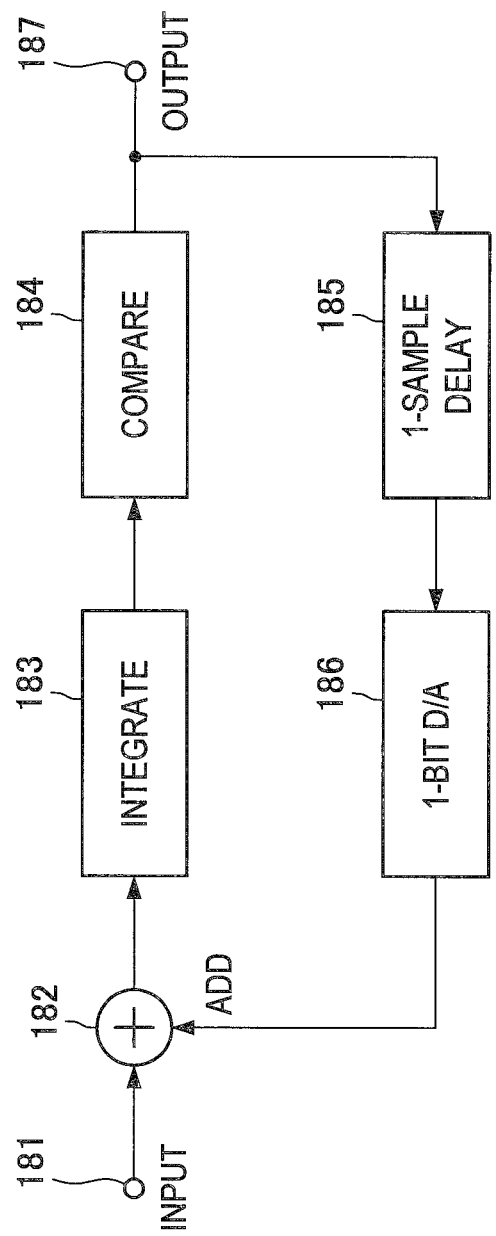
FIG. 12 is a block diagram of a ΣΔ modulation circuit for ΣΔ modulation of 1-bit digital data.

FIG. 12 is a block diagram of a ΣΔ modulation circuit for ΣΔ modulation of, for example, 1-bit digital data. In FIG. 12, an input audio signal from an input terminal 181 is supplied via an adder 182 to an integrator 183. A signal from the integrator 183 is supplied to a comparator 184 to be compared to, for example, a neutral point potential of the input audio signal for effecting 1-bit quantization every sampling period. Meanwhile, the frequency of the sampling period (sampling frequency) is, for example, 64 or 128 times 48 kHz or 44.1 kHz employed heretofore.

The 1-bit quantized data generated by the comparator 184 is supplied to a 1-sample delay unit 185 so as to be delayed one sampling period. This delayed data is converted by, for example, a 1-bit D/A converter 186 into analog signals which are then sent to an adder 182 so as to be added to the input audio signal from the input terminal 181. Then, the 1-bit quantized data generated by the comparator 184 is taken out at an output terminal 187.

Thus, with the ΣΔ modulation performed by the ΣΔ modulation circuit, a high dynamic range audio signal can be obtained with a smaller number of bits, such as 1 bit, by sufficiently raising the sampling frequency, as described in the above publication. Moreover, with the ΣΔ modulation performed by the ΣΔ modulation circuit, a broad transmission frequency can be realized. In addition, the ΣΔ modulation circuit has a circuit structure that is suited to integration, and high precision in A/D conversion can be realized relatively easily, so that the circuit has hitherto been used widely in an A/D converter, for example. The ΣΔ modulated signal can be restored to the analog audio signal by being passed through a simple analog low-pass filter. Thus, by exploiting these characteristics, the ΣΔ modulation circuit can be applied to a recorder or to data transmission handling high-quality data.

Meanwhile, it is difficult for the digital audio transmission apparatus employing the above-described ΣΔ modulation circuit to realize, with the original bit length, signal processing in the amplitude direction, as a sort of the amplitude control operation, such as fading, equalizing, filtering, crossfading, or mixing, that has been possible with the aforementioned digital audio transmission apparatus handling multibit format digital signal, such as a 16-bit or 24-bit digital signal (hereinafter referred to as a multi-bit digital audio transmission apparatus), such that favorable properties, such as broad range and high dynamic range, may not be used advantageously. Examples of the fading operation include, for example, a fade-out operation of gradually lowering the reproduced signal level as time elapses and a fade-in operation of gradually raising the audio signal level from a zero level. These fading operations are customary as the signal processing in the direction of the amplitude of the audio signal.

Figure 13:
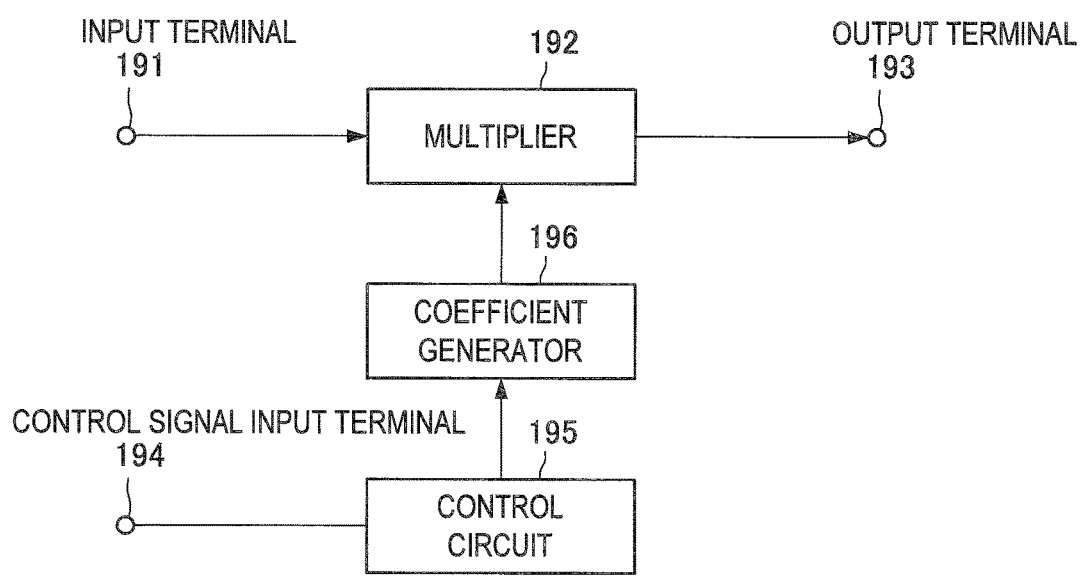
FIG. 13 is an explanatory diagram when fade processing is performed by a multibit digital audio transmission device.

Referring to FIG. 13, the above fading operation, carried out on the above multi-bit digital audio transmission apparatus, is described. Referring to FIG. 13, the multi-bit digital audio signal, such as 16-bit signal, from an input terminal 191, is taken out at an output terminal 193 via a multiplier 192. When a control signal designating the fading start timing or the fading speed is supplied to a control signal input terminal 194, this control signal is supplied to a control circuit 195 for generating a desired fading signal. Then, this fading signal is supplied to a coefficient generator 196 for generating a coefficient which gradually lowers the audio signal level to zero. Then, this coefficient is supplied to the multiplier 192.

In a circuit illustrated in FIG. 13, the operation described above causes the digital audio signal supplied to the input terminal 191 to have its signal level gradually lowered at the designated speed from the timing designated by the control signal, for example, until it is muted to a zero level, so as to be taken out at the output terminal 193, so that the fade-out operation is performed. A fade-in operation of gradually raising the audio signal level from the zero level may also be effected by reversing the sequence of generation of the coefficients. However, this processing may not be performed on the ΣΔ-modulated digital audio signal. That is, with the ΣΔ-modulated 1-bit signal, the amplitude information is also represented as a 1-bit pattern on the time axis, such that it has been difficult to multiply the amplitude by the multiplier 192 and to perform amplitude processing on the 1-bit basis.

Figure 14:
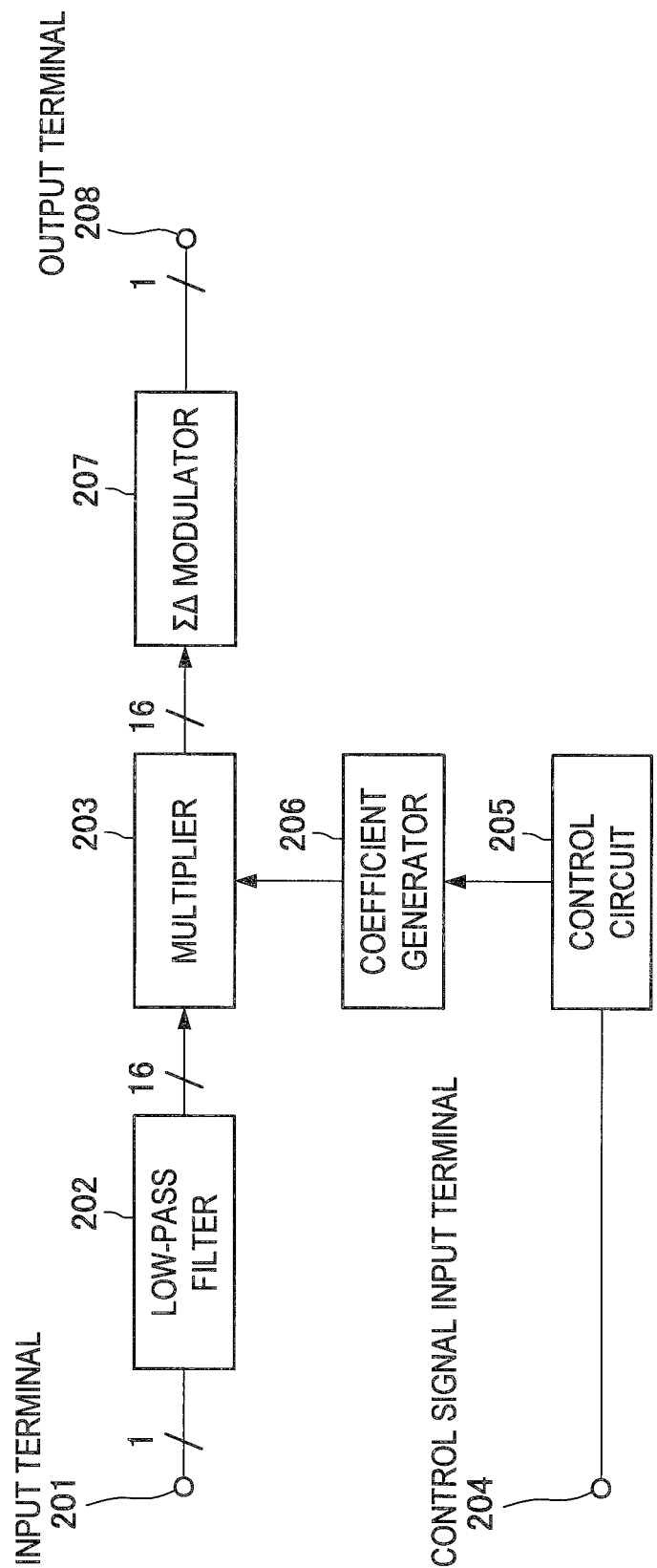

On the contrary, as shown in a circuit illustrated in FIG. 14, for example, it may be contemplated to convert the ΣΔ signal into signals of the former CD or DAT format, using a low-pass filter, and to perform the above fading operation on the converted signal. That is, in FIG. 14, a 1-bit ΣΔ signal, for example, is supplied via an input terminal 201 to a low-pass filter 202 for conversion into, for example, 16-bit multi-bit audio signal. This converted digital audio signal is sent to a multiplier 203. Also the control signal designating the fading starting timing or the fading speed is supplied to a control signal input terminal 204 and thence supplied to a control circuit 205 for generating a desired fading signal. By this fading signal supplied to a coefficient generator 206, there is generated a coefficient gradually lowering the audio signal level to zero. This coefficient is sent to the multiplier 203.

As the circuit illustrated in FIG. 14 performs the operation described above, the multi-bit digital audio signal from the low-pass filter 202, the audio signal level of which has been controlled by the coefficient from the coefficient generator 206, is taken out at the multiplier 203. This taken out digital audio signal is further sent to a ΣΔ modulator 207 for re-conversion into, for example, a 1-bit ΣΔ signal which is taken out at an output terminal 208. The ΣΔ signal from the input terminal 201, the audio signal level of which has been gradually lowered to the zero level at the designated speed from the timing designated by the control signal, for example, is taken out at the output terminal 208, and the circuit illustrated in FIG. 14 performs the so-called fade-out operation. The fade-in operation of gradually raising the audio signal level from the zero level may also be performed by reversing the sequence of coefficient generation. That is, the present device can perform the processing, such as fading.

Meanwhile, when the device with the circuit illustrated in FIG. 14 is used, the ΣΔ signal supplied to the input terminal 201 is converted at all times into, for example, a 16-bit multi-bit digital audio signal by the low-pass filter 202. That is, with the device, the ΣΔ signal is passed through the low-pass filter 202 and the ΣΔ modulator 207 even when the signal has not been processed with fading. Thus, the signal characteristics become the same as those of the former CD or DAT, for example, such that it becomes impossible to exploit characteristics proper to the ΣΔ modulation, such as broad band and high dynamic range. The processing, such as fading, can be performed by directly inputting the ΣΔ signal supplied to the input terminal 201 to the ΣΔ modulator 207 without passing the ΣΔ signal through the low-pass filter 202. However, in this case, the signal is passed through the ΣΔ modulator 207 when the signal is not processed with fading or the like, such that it becomes similarly impossible to exploit characteristics proper to the ΣΔ modulation, such as broad band and high dynamic range.

Figure 15:
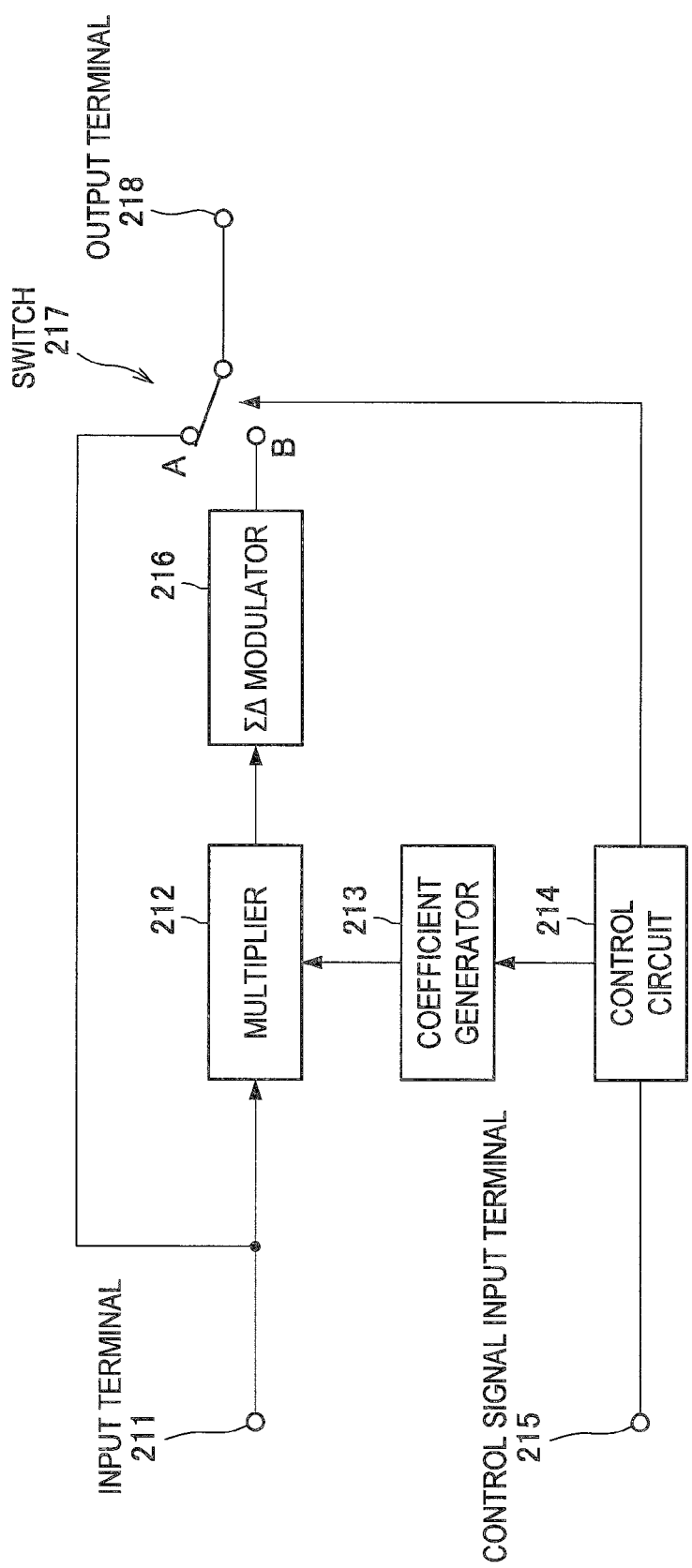

Therefore, a circuit configuration illustrated in FIG. 15 has been contemplated. As illustrated in FIG. 15, it has been contemplated to take out the original ΣΔ signal supplied to a fixed terminal A of a switch 217 at an output terminal 218 when the amplitude processing, such as fading, is not performed and to take out the ΣΔ signal re-modulated by a ΣΔ modulator 216 supplied to a fixed terminal B of the switch 217 at the output terminal 218 only when the amplitude processing is performed.

However, in the device with the circuit illustrated in FIG. 15, the above two ΣΔ signals switched by the switch 217 are signals modulated on the time axis by different ΣΔ modulators, even though the two ΣΔ signals have substantially the same analog audio signal components, so that, as indicated by the upper waveform in FIG. 16, when the signals are switched directly, significant noise is generated at the changeover point, thus rendering the device practically unusable. Thus, a digital signal processing device has been demanded which reduces the generation of noises when switching between the original ΣΔ modulated signal and the ΣΔ re-modulated signal in which the original ΣΔ modulated signal is subjected to the ΣΔ modulation again.

Figure 10:
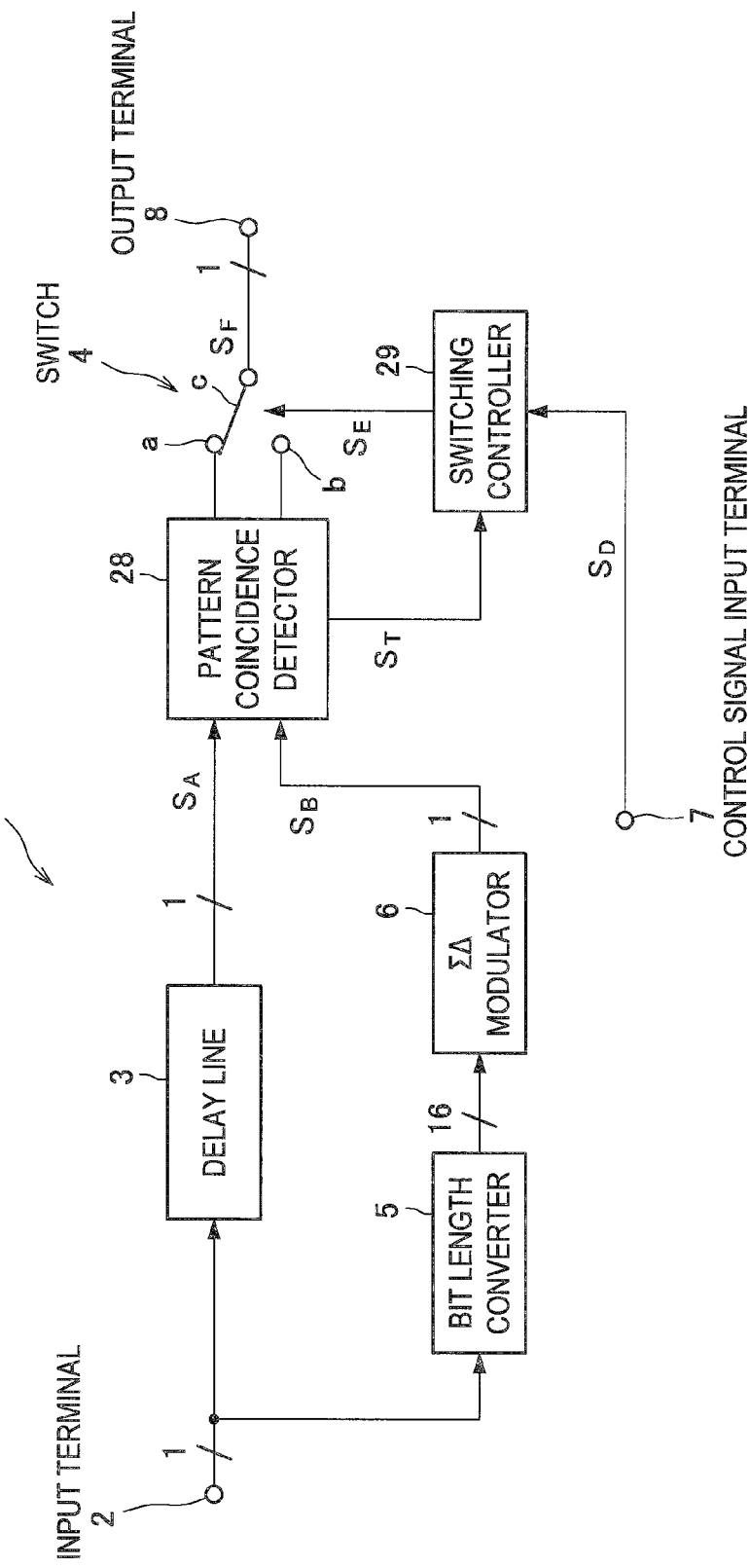
FIG. 10 is a block diagram of a digital signal processing device having a ΣΔ modulation circuit which subjects 1-bit digital data to ΣΔ modulation, for example.

FIG. 10 is a block diagram of a digital signal processing device having a ΣΔ modulation circuit which, for example, subjects 1-bit digital data to ΣΔ modulation disclosed in JP 3318823B. A digital signal processing device 27 illustrated in FIG. 10 switches between a ΣΔ modulated signal $S_A$ which is an input signal obtained by the ΣΔ modulation and a ΣΔ re-modulated signal $S_B$ obtained by subjecting the input signal to the ΣΔ modulation again for outputting. Then, the digital signal processing device 27 illustrated in FIG. 10 detects the coincidence between the ΣΔ modulated signal $S_A$ and the ΣΔ re-modulated signal $S_B$ over a plurality of samples, and then switches between the ΣΔ modulated signal $S_A$ and the ΣΔ re-modulated signal $S_B$ according to a pattern coincidence detection signal.

The digital signal processing device 27 illustrated in FIG. 10 has a delay line 3 which delays the original ΣΔ modulated signal through an input terminal 2 by only the pre-set number of samples, a ΣΔ modulator 6 having a plurality of integrators (for example, 5) and also sets the gain ratio of a first-stage feedback loop and a next-stage feedback loop to 16 and outputs the ΣΔ re-modulated signal, a bit length converter 5 which matches the amplitude level of the original ΣΔ modulated signal input into the ΣΔ modulator 6 to the amplitude level of a feedback signal to the first integrator for use in the ΣΔ modulator 6, a pattern coincidence detector 28 which monitors the original 1-bit delay signal $S_A$ from the delay line 3 and the ΣΔ re-modulated 1-bit signal $S_B$ from the ΣΔ modulator 6 every sampling timing, and a switching controller 29 which controls the switching of a changeover switch 4. The digital signal processing device 27 illustrated in FIG. 10 controls the switching of the changeover switch 4 according to a changeover control signal $S_E$ supplied from the switching controller 29, and outputs the original ΣΔ modulated signal (original 1-bit delay signal) $S_A$ which is delayed by the pre-set number of samples by the delay line 3 or the ΣΔ re-modulated signal (ΣΔ re-modulated 1-bit signal) $S_B$ from an output terminal 8.

The ΣΔ modulator 6 is constituted as a 5-stage ΣΔ modulator having five integrators, for example. In the ΣΔ modulator 6, the gain ratio of the next-stage feedback loop gain to the first-stage feedback loop gain except the integrators sandwiching a 1-bit quantizer is set to an integral value of 16.

The changeover switch 4 receives the ΣΔ re-modulated 1-bit signal $S_B$, which is obtained by being subjected to the re-ΣΔ modulation by the ΣΔ modulator 6, at a fixed terminal b as described above and, on the other hand, receives the original 1-bit delay signal $S_A$ which is delayed by the delay line 3 by 16 samples at a fixed terminal a. The changeover switch 4 brings a movable contact piece c into contact with the fixed terminal a or the fixed terminal b according to the changeover control signal $S_E$ supplied from the switching controller 29, and supplies either the original 1-bit delay signal $S_A$ or the ΣΔ re-modulated 1-bit signal $S_B$ as an output signal $S_F$ to the output terminal 8.

The pattern coincidence detector 28 monitors the original 1-bit delay signal $S_A$ from the delay line 3 and the ΣΔ re-modulated 1-bit signal $S_B$ from the ΣΔ modulator 6 every sampling timing, and then, when detecting pattern coincidence continuing over, for example, four samples, the pattern coincidence detector 28 generates a pattern coincidence detection signal $S_T$, and then supplies the same to the switching controller 29.

The switching controller 29 controls the switching of the changeover switch 4 to output either the original 1-bit delay signal $S_A$ or the ΣΔ re-modulated 1-bit signal $S_B$ as the signal output $S_F$ from the changeover switch 4.

Figure 11:
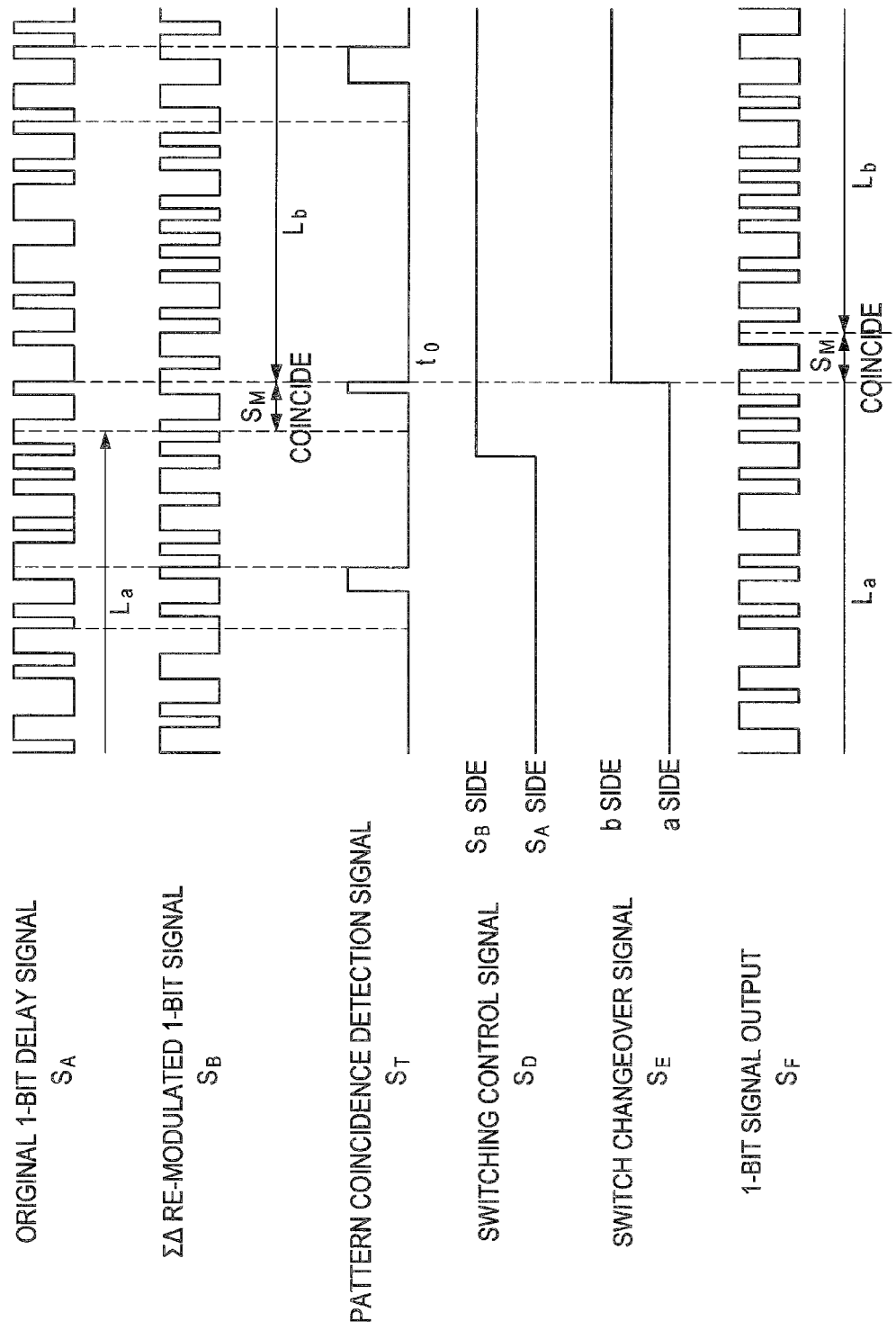
FIG. 11 is a timing chart for explaining an operation of a digital signal processing device 27 illustrated in FIG. 10.

FIG. 11 is a timing chart illustrating the operation of the digital signal processing device 27 illustrated in FIG. 10.

Directly after inversion from the side $S_A$ to the side $S_B$ of a changeover control signal $S_D$ input from the control signal input terminal 7, the switching controller 29 generates a switch changeover signal $S_E$ from the fixed terminal a to the fixed terminal b at the next sampling timing $t_0$ of reception of the pattern coincidence detection signal $S_T$ supplied from the pattern coincidence detector 28, and sets the movable contact piece c of the changeover switch 4 from its fixed terminal a to its fixed terminal b. The digital signal processing device 27 then sums a signal $S_M$ of the four sample pattern coincident portion to the original 1-bit delay signal $S_A$ for a period $L_a$ and further sums the ΣΔ re-modulated 1-bit signal $S_B$ for a period $L_b$ to the resulting signal to produce a 1-bit output signal $S_F$ which is output from the output terminal 8.

Thus, the digital signal processing device 27 illustrated in FIG. 10 first controls the changeover timing by the pattern coincidence detection by the pattern coincidence detector 28, and subsequently switches between the original 1-bit delay signal $S_A$ and the ΣΔ re-modulated 1-bit signal $S_B$, so that changeover can be done under noise suppression. In the digital signal processing device 27 illustrated in FIG. 10, the number of samples (time) for detecting pattern coincidence is not prescribed. That is, it is assumed to continuously perform the processing until the pattern coincidence is detected but it can be said that since the ΣΔ signal contains a huge number of samples, such as 2,800,000 samples or 5,600,000 samples for 1 second, the pattern coincidence can be certainly detected within 1 second in terms of probability.

Examples of media which record the ΣΔ modulated signal for selling includes a SACD. When manufacturing the SACD, in the case where it is demanded to switch between the original ΣΔ modulated signal and the ΣΔ re-modulated signal in which the original ΣΔ modulated signal is subjected to the ΣΔ modulation again within the pre-set number of samples (time), there is a possibility that the digital signal processing device 27 illustrated in FIG. 10 may not detect pattern coincidence, and therefore a significant noise arises at the changeover point.

Then, the following description describes in detail a technique capable of reducing the generation of noises at the changeover point when it is demanded to switch between the original ΣΔ modulated signal and the ΣΔ re-modulated signal the original ΣΔ modulated signal is subjected to the ΣΔ modulation again within the pre-set number of samples (time).

2. ONE EMBODIMENT OF THIS DISCLOSURE

2.1. Example of Configuration of Signal Processing Device

FIG. 1 is an explanatory view illustrating an example of the configuration of a digital signal processing device 100 according to one embodiment of the present disclosure.

Hereinafter, an example of the configuration of the digital signal processing device 100 according to one embodiment of the present disclosure is described with reference to FIG. 1.

FIG. 1 is a block diagram of a digital signal processing device having a ΣΔ modulation circuit which subjects 1-bit digital data to ΣΔ modulation, for example. The digital signal processing device 100 illustrated in FIG. 1 switches between a ΣΔ modulated signal $S_A$ which is an input signal obtained by the ΣΔ modulation and a ΣΔ re-modulated signal $S_B$ obtained by subjecting the input signal to the ΣΔ modulation again for outputting. The digital signal processing device 100 illustrated in FIG. 1 first detects the pattern coincidence between the ΣΔ modulated signal $S_A$ and the ΣΔ re-modulated signal $S_B$ over a plurality of samples for the pre-set number of samples, and then switches between the ΣΔ modulated signal $S_A$ and the ΣΔ re-modulated signal $S_B$ according to a pattern coincidence detection signal. When the digital signal processing device 100 illustrated in FIG. 1 may not detect the coincidence between the ΣΔ modulated signal $S_A$ and the ΣΔ re-modulated signal $S_B$ over a plurality of samples for the pre-set number of samples, the digital signal processing device 100 next detects the level coincidence between the ΣΔ modulated signal $S_A$ and the ΣΔ re-modulated signal $S_B$ over a plurality of samples for the pre-set number of samples, and then switches between the ΣΔ modulated signal $S_A$ and the ΣΔ re-modulated signal $S_B$ according to a level coincidence detection signal.

The digital signal processing device 100 illustrated in FIG. 1 has a delay line 103 which delays the original ΣΔ modulated signal through an input terminal 102 by only the pre-set number of samples, a ΣΔ modulator 106 having a plurality of integrators (for example, 5) and also sets the gain ratio of a first-stage feedback loop and a next-stage feedback loop to 16 and outputs the ΣΔ re-modulated signal, a bit length converter 105 which matches the amplitude level of the original ΣΔ modulated signal input into this ΣΔ modulator 106 to the amplitude level of a feedback signal to the first integrator for use in the ΣΔ modulator 106, a signal coincidence detector 130 which monitors the original 1-bit delay signal $S_A$ from the delay line 103 and the ΣΔ re-modulated 1-bit signal $S_B$ from the ΣΔ modulator 106 every sampling timing, and a switching controller 129 which controls the switching of a changeover switch 104. The digital signal processing device 100 illustrated in FIG. 1 controls the switching of the changeover switch 104 according to a changeover control signal $S_E$ supplied from the switching controller 129, and outputs the original ΣΔ modulated signal (original 1-bit delay signal) $S_A$ which is delayed by the pre-set number of samples by the delay line 103 or the ΣΔ re-modulated signal (ΣΔ re-modulated 1-bit signal) $S_B$ from an output terminal 108.

Figure 3:
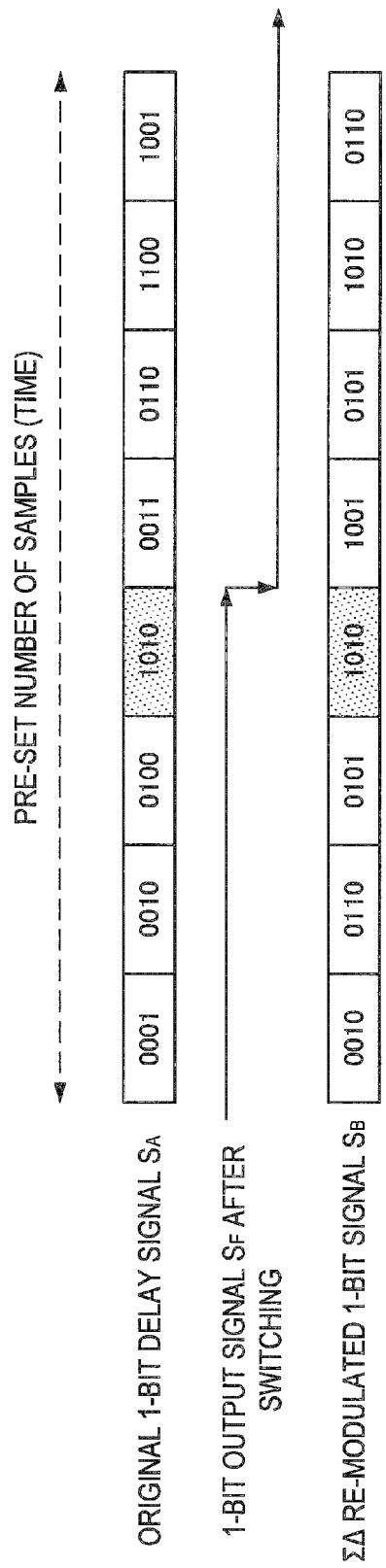
FIG. 3 is an explanatory diagram for explaining an operation of a signal coincidence detector 130.
Figure 6:
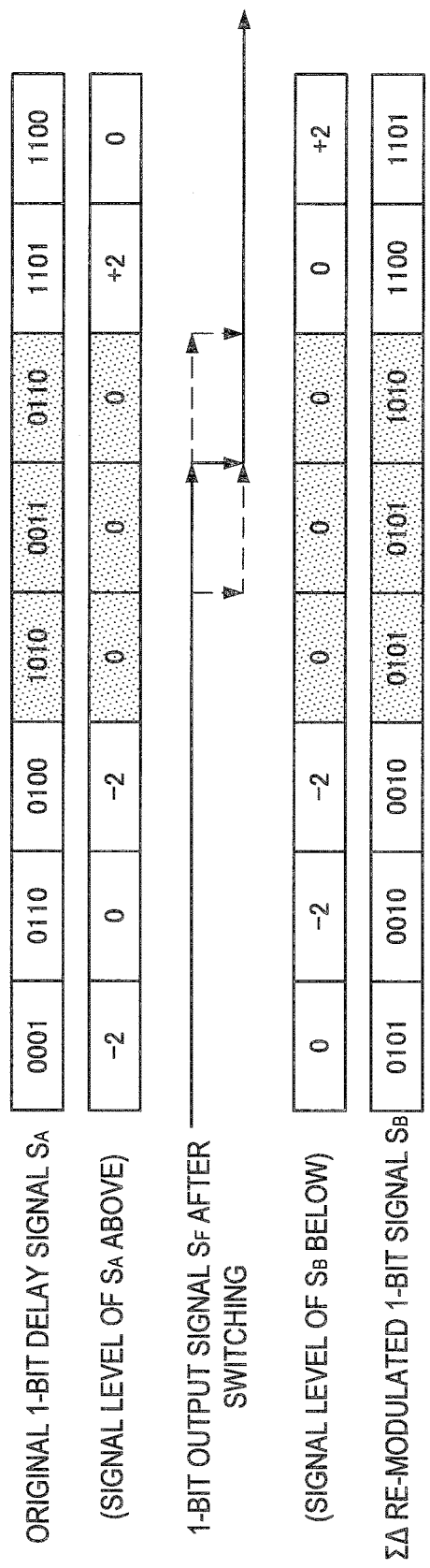
FIG. 6 is an explanatory diagram for explaining an operation of the signal coincidence detector 130.

The ΣΔ modulator 106 is constituted as a 5-stage ΣΔ modulator having five integrators disclosed in FIG. 3 and FIG. 6 of JP 3318823B, for example. In the ΣΔ modulator 106, the gain ratio of the next-stage feedback loop gain to the first-stage feedback loop gain except the integrators sandwiching a 1-bit quantizer is set to an integral value of 16.

The changeover switch 104 is an example of the signal changeover portion of the present disclosure. The changeover switch 104 receives the ΣΔ re-modulated 1-bit signal $S_B$, which is obtained by being subjected to the ΣΔ re-modulation by the ΣΔ modulator 106, at the fixed terminal b as described above and, on the other hand, receives the original 1-bit delay signal $S_A$ which is delayed by the delay line 103 by 16 samples at the fixed terminal a. The changeover switch 104 brings a movable contact piece c into contact with the fixed terminal a or the fixed terminal b according to a changeover control signal $S_E$ supplied from the switching controller 129, and supplies either the original 1-bit delay signal $S_A$ or the ΣΔ re-modulated 1-bit signal $S_B$ as an output signal $S_F$ to the output terminal 108.

The switching controller 129 is an example of the switching control portion of the present disclosure. The switching controller 129 controls the switching of the changeover switch 104, and outputs the original 1-bit delay signal $S_A$ or the ΣΔ re-modulated 1-bit signal $S_B$ from the changeover switch 104.

The signal coincidence detector 130 is an example of the signal coincidence detection portion of the present disclosure. The signal coincidence detector 130 monitors the original 1-bit delay signal $S_A$ from the delay line 103 and the ΣΔ re-modulated 1-bit signal $S_B$ from the ΣΔ modulator 106 every sampling timing for the pre-set number of samples. When the signal coincidence detector 130 detects pattern coincidence continuing over, for example, four samples, the signal coincidence detector 130 generates a coincidence detection signal $S_T$ which shows that the pattern coincidence is detected, and then supplies the same to the controller 129.

The signal coincidence detector 130 monitors the original 1-bit delay signal $S_A$ from the delay line 103 and the ΣΔ re-modulated 1-bit signal $S_B$ from the ΣΔmodulator 106 every sampling timing for the pre-set number of samples. When the signal coincidence detector 130 may not detect pattern coincidence continuing over, for example, four samples, the signal coincidence detector 130 next monitors the original 1-bit delay signal $S_A$ from the delay line 103 and the ΣΔ re-modulated 1-bit signal $S_B$ from the ΣΔ modulator 106 again every sampling timing for the pre-set number of samples. When the signal coincidence detector 130 detects the level coincidence of, for example, four samples, the signal coincidence detector 130 generates a coincidence detection signal $S_T$ which shows that the level coincidence is detected, and then supplies the same to the controller 129.

FIG. 2 is an explanatory diagram for explaining the level of 1-bit signals. Although the level of the 1-bit signal may not be directly obtained in the state of the 1-bit signal, the integration value and the average value of the 1-bit signals is calculated to be able to be locally substituted as a signal level. With respect to the amplitude of the 1-bit signal, the sampling value 1 is +1 and the sampling value 0 is −1. Therefore, the signal level of four 1-bit signal samples as shown in the first column of the table shown in FIG. 2 can be calculated as shown in the third column of the table shown in FIG. 2, for example. For example, even when the level coincidence over four samples is not detected but the coincidence of the appearance frequencies of the sampling value 0 and the sampling value 1 over four samples is detected, the detection results are equivalent. This is the appearance frequency of the sampling value 0 and the sampling value 1 of four 1-bit signal samples as shown in the second row of the table shown in FIG. 2.

In this embodiment, the signal coincidence detector 130 first detects the pattern coincidence between the ΣΔ modulated signal $S_A$ and the ΣΔ re-modulated signal $S_B$ over a plurality of samples for the pre-set number of samples. When detecting continuous pattern coincidence, the signal coincidence detector 130 generates a coincidence detection signal $S_T$ which shows that the pattern coincidence is detected. When the signal coincidence detector 130 may not detect the coincidence between the ΣΔ modulated signal $S_A$ and the ΣΔ re-modulated signal $S_B$ over a plurality of samples for the pre-set number of samples, the signal coincidence detector 130 next detects the level coincidence between the ΣΔ modulated signal $S_A$ and the ΣΔ re-modulated signal $S_B$ over a plurality of samples for the pre-set number of samples. Then, when detecting the level coincidence, the signal coincidence detector 130 generates a coincidence detection signal $S_T$ which shows that the level coincidence is detected. The operation of the signal coincidence detector 130 is described in detail with reference to the drawings.

FIG. 3 to FIG. 8 are views for explaining the operation of the signal coincidence detector 130. In FIG. 3 to FIG. 8, for simplicity, the pattern coincidence continuing over, for example, four samples, and the signal level coincidence of four samples are monitored and detected in a four-sample forward manner. The format in recording the 1-bit signals on a computer collectively handles 1-bit signals of eight samples as 1-byte data in many cases. The data access of the computer is usually performed in the byte unit. The signal coincidence detector 130 monitors and detects the pattern coincidence continuing over, for example, four samples, and the signal level coincidence of four samples for the pre-set number of samples in a four-sample forward manner, for example. By performing the monitoring and the detection in a four-sample forward manner, the signal coincidence detector 130 can efficiently perform the processing by referring to 4 bits of MSB and 4 bits of LSB of the byte data without straddling the byte boundary.

The signal coincidence detector 130 monitors the original 1-bit delay signal $S_A$ from the delay line 103 and the ΣΔ re-modulated 1-bit signal $S_B$ from the ΣΔ modulator 106 as illustrated in FIG. 3 every sampling timing in a four-sample forward manner for the pre-set number of samples. When detecting the pattern coincidence continuing over four samples at the timing of the fourth four 1-bit signal samples (1010) from the left, the signal coincidence detector 130 generates a coincidence detection signal $S_T$ which shows that the pattern coincidence is detected, and then supplies the same to the switching controller 129.

Figure 4:
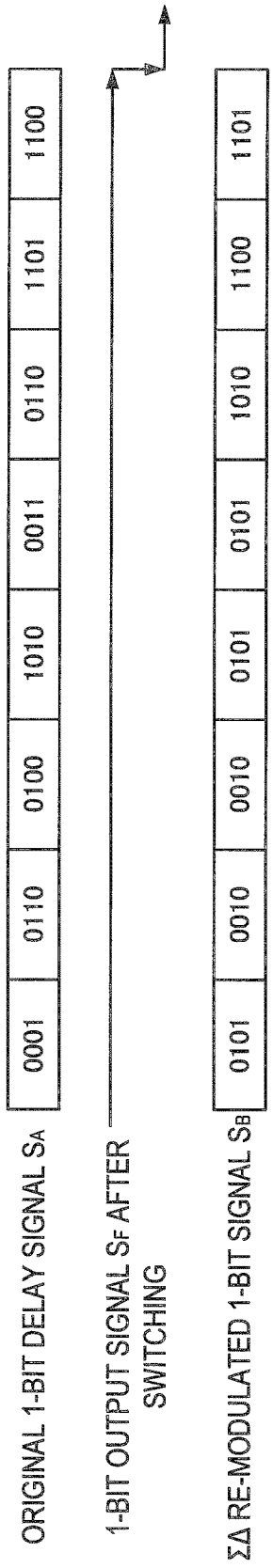
FIG. 4 is an explanatory diagram for explaining an operation of the signal coincidence detector 130.

However, the signal coincidence detector 130 sometimes compares signals in which the pattern coincidence continuing over four samples may not be detected. For example, it is assumed that, as a result of monitoring the original 1-bit delay signal $S_A$ from the delay line 103 and the ΣΔ re-modulated 1-bit signal $S_B$ from the ΣΔ modulator 106 as illustrated in FIG. 4 every sampling timing in a four-sample forward manner for the pre-set number of samples, the signal coincidence detector 130 may not detect pattern coincidence continuing over four samples.

Figure 5:
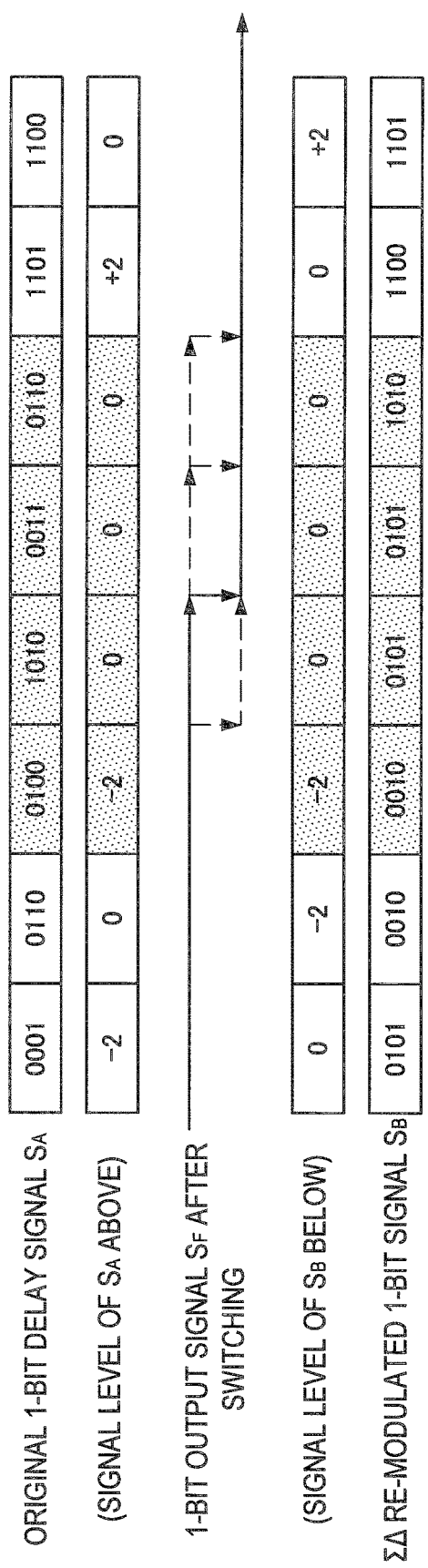
FIG. 5 is an explanatory diagram for explaining an operation of the signal coincidence detector 130.

In this case, the signal coincidence detector 130 monitors again the original 1-bit delay signal $S_A$ from the delay line 103 and the ΣΔ re-modulated 1-bit signal $S_B$ from ΣΔ modulator 106 as illustrated in FIG. 5 every sampling timing in a four-sample forward manner for the pre-set number of samples. When detecting signal level coincidence at a timing of the third four 1-bit signal samples (signal level −2) from the left, the signal coincidence detector 130 generates a coincidence detection signal $S_T$ which shows that the level coincidence is detected, and then supplies the same to the switching controller 129.

The detection timing of the signal level coincidence of the signal coincidence detector 130 may be the timing of the third four 1-bit signal samples from the left in FIG. 5 in which the coincidence is first detected or may be any timing up to the sixth four 1-bit signal samples from the left in FIG. 5 until which the signal level coincidence continues. In order to more effectively perform the changeover, it is safe to set the detection timing to the timing near the center of the four 1-bit signal samples with the highest signal level coincidence continuity. In the case of FIG. 5, it is desirable that the signal coincidence detector 130 detects the signal level coincidence at the timing of the fourth four 1-bit signal samples from the left, for example. This is because it is considered that, when the signals are restored to analog signals, there is a possibility that the date may vary when the timing is closer to the boundary, but when the detection timing of the signal level coincidence is set to the timing near the center, a signal difference before and after the changeover is small.

Moreover, the signal coincidence detector 130 may select the detection timing of the signal level coincidence from four 1-bit signal samples in which the same signal level coincidence continues. In the example illustrated in FIG. 6, the signal level of 0 continues from the fourth sample set to the sixth sample set from the left. In this case, the detection timing of the signal level coincidence of the signal coincidence detector 130 may be the timing of the fourth four 1-bit signal samples from the left in FIG. 6 in which the coincidence is first detected or may be any timing up to the sixth four 1-bit signal samples from the left in FIG. 6 until which the signal level coincidence continues. In order to more effectively perform the changeover, it is safe to set the detection timing to the timing near the center of the four 1-bit signal samples with the highest signal level coincidence continuity. In the case of FIG. 6, it is desirable that the signal coincidence detector 130 detects the signal level coincidence at the timing of the fifth four 1-bit signal samples from the left, for example. This is because, as in the case where the changeover is performed near the center of the 1-bit signals with the highest signal level coincidence continuity, it is considered that, when the signals are restored to analog signals, there is a possibility that the date may vary when the timing is closer to the boundary, but when the detection timing of the signal level coincidence is set to the timing near the center, a signal difference before and after changeover is small.

Figure 7:
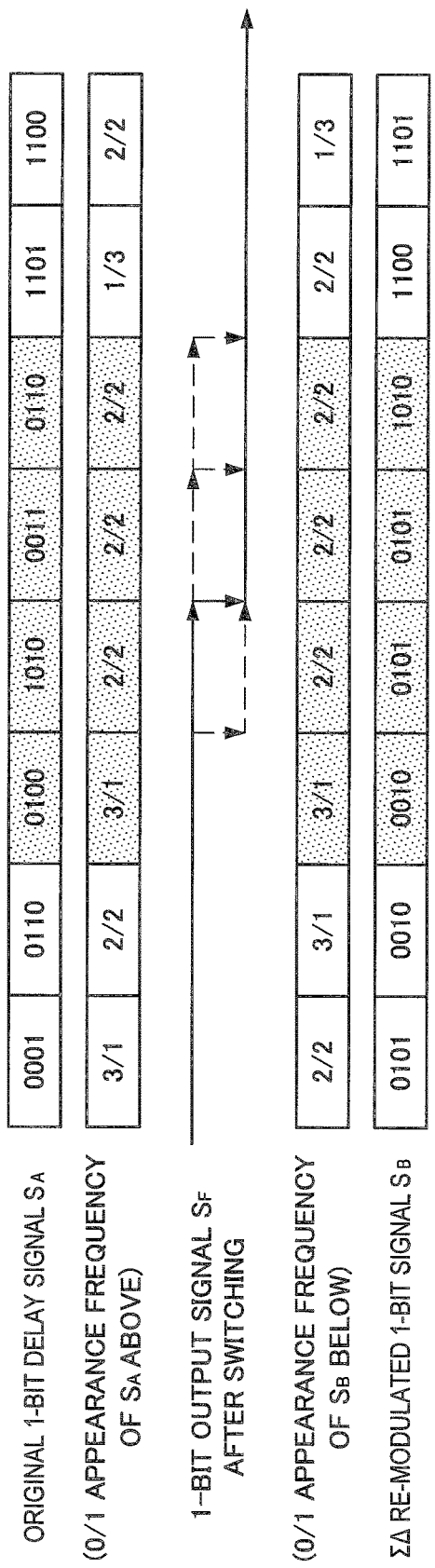
FIG. 7 is an explanatory diagram for explaining an operation of the signal coincidence detector 130.

The signal coincidence detector 130 monitors again the original 1-bit delay signal $S_A$ from the delay line 103 and the $\Sigma\Delta$ re-modulated 1-bit signal $S_B$ from $\Sigma\Delta$ modulator 106 as illustrated in FIG. 7 every sampling timing in a four-sample forward manner for the pre-set number of samples. Then, when detecting appearance frequency coincidence at a timing of the third four 1-bit signal samples (0/1 appearance frequency which is the number of times of the appearance of 0 and the appearance of 1 is 3/1) from the left, the signal coincidence detector 130 generates a coincidence detection signal $S_T$ which shows that the appearance frequencies coincide with each other, and then supplies the same to the switching controller 129.

In the signal coincidence detector 130, the detection timing of the 0/1 appearance frequency coincidence may be the timing of the third four 1-bit signal samples from the left in FIG. 7 in which the coincidence is first detected or may be any timing up to the sixth four 1-bit signal samples from the left in FIG. 7 until which the 0/1 appearance frequency coincidence continues. In order to more effectively perform the changeover, it is safe to set the detection timing to the timing near the center of four 1-bit signal samples with the highest appearance frequency coincidence continuity. In the case of FIG. 7, it is desirable that the signal coincidence detector 130 detects the 0/1 appearance frequency coincidence at the timing of the fourth four 1-bit signal samples from the left, for example.

Figure 8:
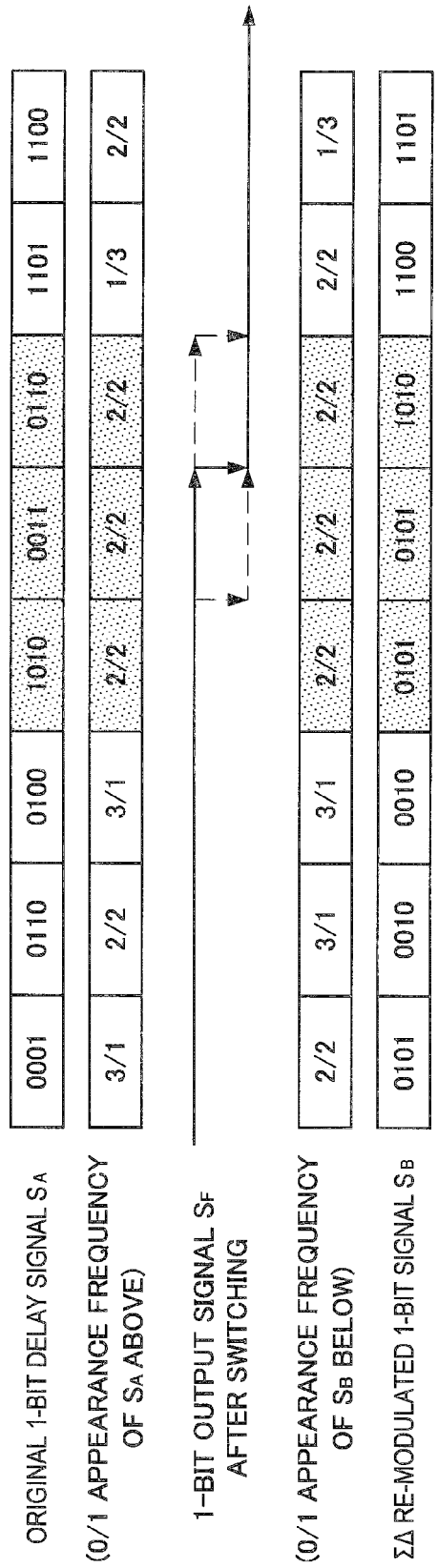
FIG. 8 is an explanatory diagram for explaining an operation of the signal coincidence detector 130.

The signal coincidence detector 130 may select the detection timing of the 0/1 appearance frequency coincidence from four 1-bit signal samples in which the same 0/1 appearance frequency coincidence continues. In the example illustrated in FIG. 8, the 0/1 appearance frequencies continuously coincide with 2/2 from the fourth timing to the sixth timing from the left. In this case, the detection timing of the 0/1 appearance frequency coincidence of the signal coincidence detector 130 may be the timing of the fourth four 1-bit signal samples from the left in which the coincidence is first detected or may be any timing up to the sixth four 1-bit signal samples from the left until which the 0/1 appearance frequency coincidence continues. In order to more effectively perform the changeover, it is safe to set the detection timing to the timing near the center of the four 1-bit signal samples with the highest appearance frequency coincidence continuity. In the case of FIG. 8, it is desirable that the signal coincidence detector 130 detects the 0/1 appearance frequency coincidence at the timing of the fifth four 1-bit signal samples from the left, for example.

When detecting samples in which the patterns illustrated in FIG. 5 and the patterns illustrated in FIG. 6 continue, for example, the signal coincidence detector 130 may select either the sample as the coincident sample or may select a part where the coincidence continues the longest as the coincident sample.

FIG. 3 to FIG. 8 illustrate examples in which the changeover to the $\Sigma\Delta$ re-modulated 1-bit signal $S_B$ from the $\Sigma\Delta$ modulator 106 from the original 1-bit delay signal $S_A$ from the delay line 103. Also in the case of the changeover to the original 1-bit delay signal $S_A$ from the delay line 103 from the $\Sigma\Delta$ re-modulated 1-bit signal $S_B$ from the $\Sigma\Delta$ modulator 106, the changeover may be similarly performed with the samples in which the signal levels and the 0/1 appearance frequencies coincide with each other.

Thus, the example of the configuration of the digital signal processing device 100 according to one embodiment of the present disclosure is described. Since the digital signal processing device 100 according to one embodiment of the present disclosure has the configuration illustrated in FIG. 1, the digital signal processing device 100 according to one embodiment of the present disclosure can more certainly reduce the generation of noises at the changeover point when switching between the $\Sigma\Delta$ modulated signal $S_A$ and the $\Sigma\Delta$ re-modulated signal $S_B$. Then, an example of the operation of the digital signal processing device 100 according to one embodiment of the present disclosure is described.

2.2. Example of Operation of Signal Processing Device

Figure 9:
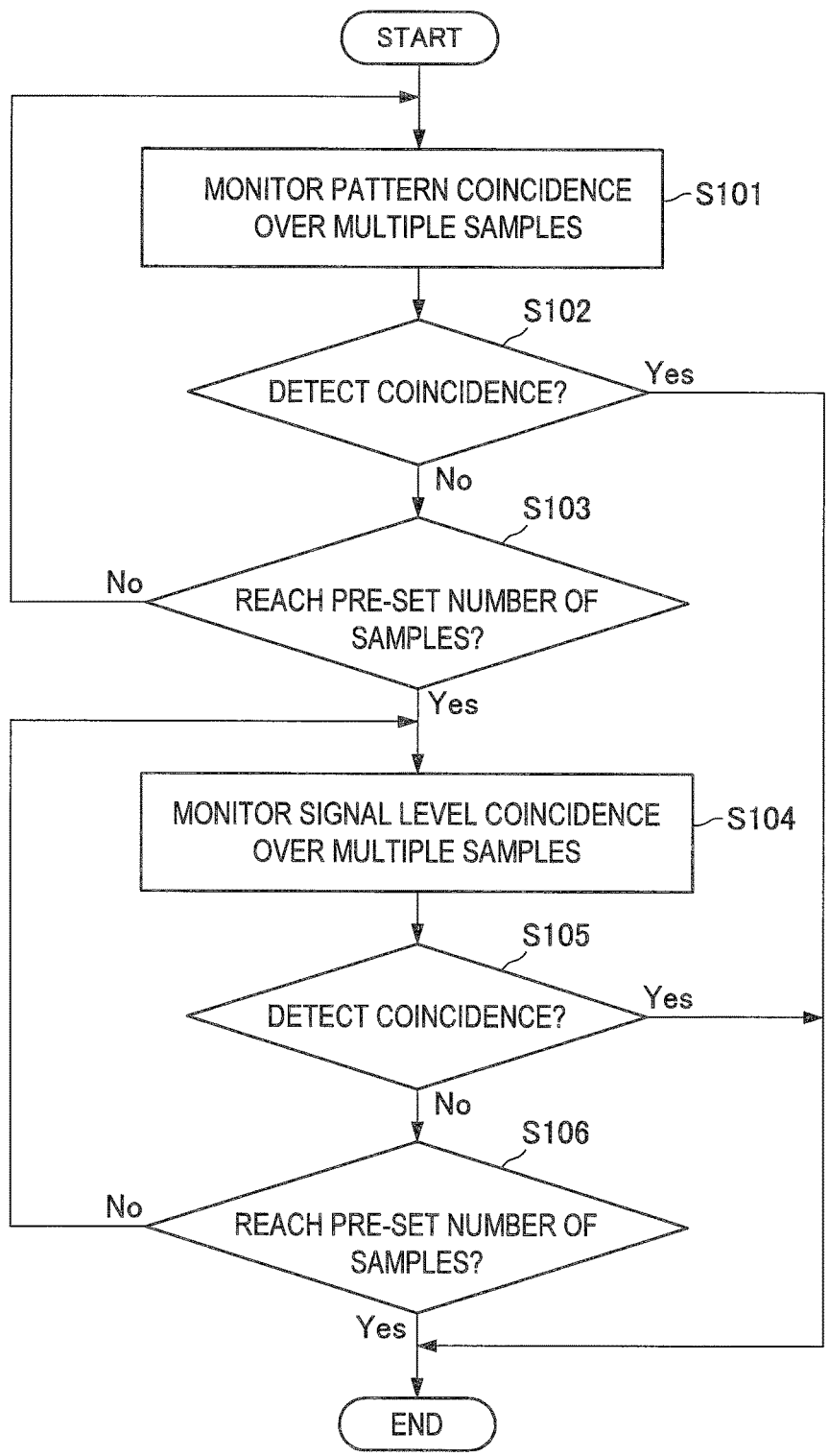
FIG. 9 is a flowchart illustrating an example of an operation of the digital signal processing device 100 according to one embodiment of the present disclosure.

FIG. 9 is a flowchart illustrating an example of the operation of the digital signal processing device 100 according to one embodiment of the present disclosure. FIG. 9 illustrates an example of the processing of the signal coincidence detector 130 contained in the digital signal processing device 100. Hereinafter, an example of the operation of the digital signal processing device 100 according to one embodiment of the present disclosure is described with reference to FIG. 9. When the processing is started, the signal coincidence detector 130 first monitors the original 1-bit delay signal $S_A$ from the delay line 103 and the $\Sigma\Delta$ re-modulated 1-bit signal $S_B$ from the $\Sigma\Delta$ modulator 106 every sampling timing for the pre-set number of samples (Step S101).

Subsequently, it is judged whether or not the signal coincidence detector 130 detects the pattern coincidence continuing over, for example, four samples (Step S102). When the pattern coincidence continuing over four samples is detected, (Step S102, Yes), the signal coincidence detector 130 generates a coincidence detection signal $S_T$ which shows that pattern coincidence is detected, supplies the same to the switching controller 129, and then ends the processing. On the other hand, when the pattern coincidence continuing over, for example, four samples is not detected, (Step S102, No), the signal coincidence detector 130 then judges whether or not the sample number reaches the pre-set number of samples (Step S103).

When the sample number does not reach the pre-set number of samples (Step S103, No), the signal coincidence detector 130 returns to Step S101, and then repeats the processing. On the other hand, when the sample number reaches the pre-set number of samples (Step S103, Yes), the signal coincidence detector 130 then monitors the original 1-bit delay signal $S_A$ from the delay line 103 and the $\Sigma\Delta$ re-modulated 1-bit signal $S_B$ from the $\Sigma\Delta$ modulator 106 again every sampling timing for the pre-set number of samples in the same section as the section of the target samples from Step S101 to Step S103 (Step S104).

Subsequently, it is judged whether or not the signal coincidence detector 130 detects the signal level coincidence continuing over, for example, four samples (Step S105). When the signal level coincidence continuing over four samples is detected (Step S105, Yes), the signal coincidence detector 130 generates a coincidence detection signal $S_T$ which shows that level coincidence is detected, supplies the same to the controller 129, and then ends the processing. On the other hand, when the signal level coincidence continuing over, for example, four samples is not detected, (Step S105, No), the signal coincidence detector 130 then judges whether or not the sample number reaches the pre-set number of samples (Step S106). When the sample number does not reach the pre-set number of samples (Step S106, No), the signal coincidence detector 130 returns to Step S104, and then repeats the processing. On the other hand, when the sample number reaches the pre-set number of samples (Step S106, Yes), the signal coincidence detector 130 ends the processing.

In this embodiment, the signal coincidence detector 130 first attempts to detect the pattern coincidence between the $\Sigma\Delta$ modulated signal $S_A$ and the $\Sigma\Delta$ re-modulated signal $S_B$ over a plurality of samples for the pre-set number of samples. When the pattern coincidence is detected, the signal coincidence detector 130 generates a coincidence detection signal $S_T$ which shows that the pattern coincidence is detected and the switching controller 129 switches between the $\Sigma\Delta$ modulated signal $S_A$ and the $\Sigma\Delta$ re-modulated signal $S_B$ according to the coincidence detection signal $S_T$ generated by the signal coincidence detector 130.

When the coincidence between the $\Sigma\Delta$ modulated signal $S_A$ and the $\Sigma\Delta$ re-modulated signal $S_B$ over a plurality of samples may not be detected for the pre-set number of samples, the signal coincidence detector 130 next attempts to detect the level coincidence between the $\Sigma\Delta$ modulated signal $S_A$ and the $\Sigma\Delta$ re-modulated signal $S_B$ over a plurality of samples for the pre-set number of samples. When the level coincidence is detected, the signal coincidence detector 130 generates a coincidence detection signal $S_T$ which shows that level coincidence is detected and the switching controller 129 switches between the $\Sigma\Delta$ modulated signal $S_A$ and the $\Sigma\Delta$ re-modulated signal $S_B$ according to the coincidence detection signal $S_T$ generated by the signal coincidence detector 130.

The signal coincidence detector 130 attempts to detect coincidence of the 0/1 appearance frequency between the $\Sigma\Delta$ modulated signal $S_A$ and the $\Sigma\Delta$ re-modulated signal $S_B$ over a plurality of samples for the pre-set number of samples.

When the coincidence of the 0/1 of appearance frequency is detected, the signal coincidence detector 130 generates a coincidence detection signal $S_T$ which shows that coincidence of the 0/1 of appearance frequency is detected and the switching controller 129 switches between the $\Sigma\Delta$ modulated signal $S_A$ and the $\Sigma\Delta$ re-modulated signal $S_B$ according to the coincidence detection signal $S_T$ generated by the signal coincidence detector 130.

In addition to the operation examples described above, the signal coincidence detector 130 may monitor both the pattern coincidence and the level coincidence between the $\Sigma\Delta$ modulated signal $S_A$ and the $\Sigma\Delta$ re-modulated signal $S_B$ over a plurality of samples for the pre-set number of samples. Then, the signal coincidence detector 130 may detect the pattern coincidence or the level coincidence after the end of the monitoring of the pre-set number of samples, and then may generate a coincidence detection signal $S_T$ which shows that the pattern coincidence is detected or a coincidence detection signal $S_T$ which shows that the level coincidence is detected. It may be configured so that the switching controller 129 switches between the $\Sigma\Delta$ modulated signal $S_A$ and the $\Sigma\Delta$ re-modulated signal $S_B$ according to the coincidence detection signal $S_T$ generated by the signal coincidence detector 130.

This embodiment describes the case where the signal coincidence detector 130 first attempts to detect the pattern coincidence between the $\Sigma\Delta$ modulated signal $S_A$ and the $\Sigma\Delta$ re-modulated signal $S_B$ over a plurality of samples for the pre-set number of samples, and then attempts to detect the level coincidence between the $\Sigma\Delta$ modulated signal $S_A$ and the $\Sigma\Delta$ re-modulated signal $S_B$ over a plurality of samples for the pre-set number of samples but the present disclosure is not limited to the example. For example, the signal coincidence detector 130 may perform the signal coincidence detection in a multistage manner by the use of the feature amount serving as another basis of the signal coincidence. When the signal coincidence detection is performed in a multistage manner, in the case where there is a necessity of switching between the original $\Sigma\Delta$ modulated signal and the $\Sigma\Delta$ re-modulated signal in which the original $\Sigma\Delta$ modulated signal is subjected to the $\Sigma\Delta$ modulation again within the pre-set number of samples (time), the generation of the noises at the changeover point can be reduced with higher probability.

As described above, the digital signal processing device 100 in this embodiment first attempts to detect the pattern coincidence between the $\Sigma\Delta$ modulated signal $S_A$ and the $\Sigma\Delta$ re-modulated signal $S_B$ over a plurality of samples for the pre-set number of samples by the signal coincidence detector 130. When the pattern coincidence is detected, the signal coincidence detector 130 generates a coincidence detection signal $S_T$ which shows that the pattern coincidence is detected and the switching controller 129 switches between the $\Sigma\Delta$ modulated signal $S_A$ and the $\Sigma\Delta$ re-modulated signal $S_B$ according to the coincidence detection signal $S_T$ generated by the signal coincidence detector 130.

When the coincidence between the $\Sigma\Delta$ modulated signal $S_A$ and the $\Sigma\Delta$ re-modulated signal $S_B$ over a plurality of samples may not be detected for the pre-set number of samples, the signal coincidence detector 130 next attempts to detect the level coincidence between the $\Sigma\Delta$ modulated signal $S_A$ and the $\Sigma\Delta$ re-modulated signal $S_B$ over a plurality of samples for the pre-set number of samples. When the level coincidence is detected, the signal coincidence detector 130 generates a coincidence detection signal $S_T$ which shows that level coincidence is detected and the switching controller 129 switches between the $\Sigma\Delta$ modulated signal $S_A$ and the ΣΔ re-modulated signal $S_B$ according to the coincidence detection signal $S_T$ generated by the signal coincidence detector 130. The digital signal processing device 100 in this embodiment can more certainly reduce the generation of noises at the changeover point by switching between the ΣΔ modulated signal $S_A$ and the ΣΔ re-modulated signal $S_B$ as described above.

3. CONCLUSION

As described above, the digital signal apparatus 100 which switches between the ΣΔ modulated signal $S_A$ and the ΣΔ re-modulated signal $S_B$ is provided according to one embodiment of the present disclosure. When the digital signal apparatus 100 according to one embodiment of the present disclosure switches between the ΣΔ modulated signal $S_A$ and the ΣΔ re-modulated signal $S_B$, the digital signal apparatus 100 first attempts to detect the pattern coincidence between the ΣΔ modulated signal $S_A$ and the ΣΔ re-modulated signal $S_B$ over a plurality of samples for the pre-set number of samples. When the pattern coincidence is detected, the digital signal apparatus 100 generates the coincidence detection signal $S_T$ which shows that pattern coincidence is detected, and then switches between the ΣΔ modulated signal $S_A$ and the ΣΔ re-modulated signal $S_B$ according to the coincidence detection signal $S_T$.

When the coincidence between the ΣΔ modulated signal $S_A$ and the ΣΔ re-modulated signal $S_B$ over a plurality of samples may not be detected for the pre-set number of samples, the digital signal apparatus 100 next attempts to detect the level coincidence between the ΣΔ modulated signal $S_A$ and the ΣΔ re-modulated signal $S_B$ over a plurality of samples for the pre-set number of samples. When the level coincidence is detected, the digital signal apparatus 100 generates the coincidence detection signal $S_T$ which shows that level coincidence is detected, and then switches between the ΣΔ modulated signal $S_A$ and the ΣΔ re-modulated signal $S_B$ according to the coincidence detection signal $S_T$. The digital signal processing device 100 in this embodiment can more certainly reduce the generation of noises at the changeover point by switching between the ΣΔ modulated signal $S_A$ and the ΣΔ re-modulated signal $S_B$ as described above.

For example, as in a small recording/reproducing apparatus in which it is difficult to provide high-performance hardware and processing is performed by software, when it is demanded to switch between the original ΣΔ modulated signal and the ΣΔ re-modulated signal in which the original ΣΔ modulated signal is subjected to the ΣΔ modulation again within the pre-set number of samples (time), the generation of noises at the changeover point can be more certainly reduced by switching between the ΣΔ modulated signal $S_A$ and the ΣΔ re-modulated signal $S_B$ according to the embodiment of the present disclosure.

The digital signal processing device 100 according to one embodiment of the present disclosure is suitable for the use of an apparatus which converts analog signals into digital signals for recording, particularly a recording/reproducing apparatus which records sound, as described above. However, it is a matter of course that the digital signal processing device 100 is suitable for the use of apparatuses other than the recording/reproducing apparatus insofar as the apparatuses switch between the original ΣΔ modulated signal and the ΣΔ re-modulated signal to thereby record digital signals. Each step in the processing performed by each device of this specification may not be performed in time sequence in accordance with the order shown in the sequence diagram or the flow chart. For example, each step in the processing performed by each device may be processed in order different from the order shown in the flow chart or may be processed in parallel.

Moreover, a computer program for causing hardware built in each device, such as CPU, ROM, and RAM, to demonstrate a function equivalent to that in the configuration of each device described above can also be created. Moreover, a storage medium in which the computer program is stored can also be provided. Moreover, a series of processing can also be achieved by hardware by constituting each functional block shown in the functional block diagram with hardware.

As described above, the suitable embodiment of the present disclosure is described in detail with reference to the accompanying drawings but the technical scope of the present disclosure is not limited to the example. It should be understood by those skilled in the art that various modifications, combinations, sub-combinations and alterations may occur depending on design requirements and other factors insofar as they are within the scope of the appended claims or the equivalents thereof.

The effects described in this specification are merely descriptive or illustrative and are not restrictive. More specifically, other effects obvious to a person skilled in the art from the description of this specification may be demonstrated with the above-described effects or in place of the above-described effects.

Additionally, the present technology may also be configured as below.

(1) A signal processing device including:

a signal coincidence detection portion which detects samples, in which values based on a number of times of appearance of bits coincide with each other over a plurality of samples within a pre-set period, between a first modulated signal obtained by delaying an input signal obtained by ΣΔ modulation and a second modulated signal obtained by subjecting the input signal to the ΣΔ modulation again;

a signal changeover portion which switches between the first modulated signal and the second modulated signal for outputting; and a switching control portion which controls the switching between the first modulated signal and the second modulated signal by the signal changeover portion in the samples in which the values based on the number of times of the appearance coincide with each other obtained by the signal coincidence detection portion.

(2) The signal processing device according to (1), wherein the signal coincidence detection portion detects a section of samples in which the coincidence of the values based on the number of times of the appearance continues, and wherein the switching control portion controls the switching between the first modulated signal and the second modulated signal in the section of the samples.

(3) The signal processing device according to (2), wherein the signal coincidence detection portion detects a section of samples in which the values based on the number of times of the appearance continuously coincide with each other with the same value, and wherein the switching control portion controls the switching between the first modulated signal and the second modulated signal in the section of the samples.

(4) The signal processing device according to (2), wherein the switching control portion controls to perform the switching between the first modulated signal and the second modulated signal with any sample other than a first sample and a final sample in the section of the samples.

(5) The signal processing device according to (2),
wherein, when the signal coincidence detection portion detects a plurality of the sections of the samples, the switching control portion controls the switching between the first modulated signal and the second modulated signal in the longest section of the samples.

(6) The signal processing device according to any one of (1) to (5),
wherein, when the signal coincidence detection portion attempts to detect samples in which patterns of bits over a plurality of samples within the pre-set period coincide with each other and when samples in which the patterns coincide with each other are not present, the signal coincidence detection portion detects samples in which values based on a number of times of appearance of the bits coincide with each other over a plurality of samples within the pre-set period.

(7) The signal processing device according to any one of (1) to (6),
wherein the value based on the number of times of the appearance of the bits over the plurality of samples is a value of a signal level over the plurality of samples.

(8) The signal processing device according to any one of (1) to (6),
wherein the value based on the number of times of the appearance of the bits over the plurality of samples is a number of times of appearance frequency of the bits over the plurality of samples.

(9) A signal processing method including:
detecting samples, in which values based on a number of times of appearance of bits coincide with each other over a plurality of samples within a pre-set period, between a first modulated signal obtained by delaying an input signal obtained by $\Sigma\Delta$ modulation and a second modulated signal obtained by subjecting the input signal to the $\Sigma\Delta$ modulation again;
switching between the first modulated signal and the second modulated signal for outputting; and
controlling the switching between the first modulated signal and the second modulated signal in the samples in which the values based on the number of times of the appearance coincide with each other.

(10) A computer program, which causes a computer to execute the following processes of:
detecting samples, in which values based on a number of times of appearance of bits coincide with each other over a plurality of samples within a pre-set period, between a first modulated signal obtained by delaying an input signal obtained by $\Sigma\Delta$ modulation and a second modulated signal obtained by subjecting the input signal to the $\Sigma\Delta$ modulation again;
switching between the first modulated signal and the second modulated signal for outputting; and
controlling the switching between the first modulated signal and the second modulated signal in the samples in which the values based on the number of times of the appearance coincide with each other.

What is claimed is:

1. A signal processing device, comprising:
a signal coincidence detection portion configured to detect samples in which values, obtained based on a number of times of appearance of bits in a first modulated signal and a second modulated signal, coincide with each other over a plurality of samples within a set period, wherein the first modulated signal is a $\Sigma\Delta$ modulated input signal that is delayed and the second modulated signal is the $\Sigma\Delta$ modulated input signal that is again subjected to the $\Sigma\Delta$ modulation;
a signal changeover portion configured to switch between the first modulated signal and the second modulated signal to output the first modulated signal or the second modulated signal; and
a switching control portion configured to control the switch between the first modulated signal and the second modulated signal based on the detected samples in which the values, obtained by the signal coincidence detection portion, coincide with each other.

2. The signal processing device according to claim 1,
wherein the signal coincidence detection portion is further configured to detects one or more of the samples in which the coincidence of the values obtained based on the number of times of the appearance of the bits in the first modulated signal and the second modulated signal is successively repeated, and
wherein the switching control portion is further configured to control the switch between the first modulated signal and the second modulated signal based on the detected one or more of the samples.

3. The signal processing device according to claim 2,
wherein the signal coincidence detection portion is further configured to detect the one or more of the samples in which the values obtained based on the number of times of the appearance of the bits in the first modulated signal and the second modulated signal continuously coincide with each other to have the same value for each successive repetition, and
wherein the switching control portion is further configured to control the switch between the first modulated signal and the second modulated signal based on the detected one or more of the samples.

4. The signal processing device according to claim 2,
wherein the switching control portion is further configured to control the switch between the first modulated signal and the second modulated signal with a sample other than a first sample and a final sample in the detected one or more of the samples.

5. The signal processing device according to claim 2,
wherein, in an event the signal coincidence detection portion detects a plurality of the one or more of the samples, the switching control portion is further configured to control the switch between the first modulated signal and the second modulated signal in a part of the plurality of the one or more of the samples that has repeated for a longest duration.

6. The signal processing device according to claim 1,
wherein, in an event the signal coincidence detection portion attempts to detect samples in which patterns of bits over the plurality of samples within the set period coincide with each other and in an event samples in which the patterns coincide with each other are absent, the signal coincidence detection portion is further configured to detect the samples in which the values based on the number of times of appearance of the bits in the first modulated signal and the second modulated signal coincide with each other over the plurality of samples within the set period.

7. The signal processing device according to claim 1,
wherein the values obtained based on the number of times of the appearance of the bits in the first modulated signal and the second modulated signal over the plurality of samples is a value of a signal level over the plurality of samples.

8. The signal processing device according to claim 1, wherein the values obtained based on the number of times of the appearance of the bits in the first modulated signal and the second modulated signal over the plurality of samples is a number of times of appearance frequency of the bits in the first modulated signal and the second modulated signal over the plurality of samples.

9. A signal processing method, comprising:

detecting samples, in which values obtained based on a number of times of appearance of bits in a first modulated signal and a second modulated signal coincide with each other over a plurality of samples within a set period, wherein the first modulated signal is a ΣΔ modulated input signal that is delayed and the second modulated signal is the ΣΔ modulated input signal that is again subjected to the ΣΔ modulation;

switching between the first modulated signal and the second modulated signal to output one of the first modulated signal or the second modulated signal; and controlling the switching between the first modulated signal and the second modulated signal based on the samples in which the values coincide with each other.

10. A non-transitory computer-readable storage medium having stored thereon, a set of computer-executable instructions for causing an information processing apparatus to execute operations comprising:

detecting samples, in which values obtained based on a number of times of appearance of bits in a first modulated signal and a second modulated signal coincide with each other over a plurality of samples within a set period, wherein the first modulated signal is a ΣΔ modulated input signal that is delayed and the second modulated signal is the ΣΔ modulated input signal that is again subjected to the ΣΔ modulation;

switching between the first modulated signal and the second modulated signal to output one of the first modulated signal or the second modulated signal; and controlling the switching between the first modulated signal and the second modulated signal based on the samples in which the values coincide with each other.

11. The signal processing device according to claim 1, wherein the signal coincidence detection portion is further configured to detect the samples in which values obtained based on the number of times of appearance of the bits in the first modulated signal and the second modulated signal coincide with each other over the plurality of samples within a set period, in an event a pattern of bits in the first modulated signal differ with respect to a pattern of bits in the second modulated signal.

* * * * *